US010330299B1

(12) United States Patent
Ivey (10) Patent No.: US 10,330,299 B1
(45) Date of Patent: Jun. 25, 2019

(54) ELECTRONIC RACK CROWN

(71) Applicant: Mitek Corp., Inc., Phoenix, AZ (US)

(72) Inventor: Johnathan Ivey, Chandler, AZ (US)

( * ) Notice: Subject to any disclaimer, the term of this patent is extended or adjusted under 35 U.S.C. 154(b) by 0 days.

(21) Appl. No.: 16/022,077

(22) Filed: Jun. 28, 2018

Related U.S. Application Data

(63) Continuation-in-part of application No. 15/994,721, filed on May 31, 2018.

(51) Int. Cl.
| H05K 5/02 | (2006.01) |
| H05K 7/18 | (2006.01) |
| F21V 23/00 | (2015.01) |
| F21V 23/04 | (2006.01) |
| G08B 5/36 | (2006.01) |
| F21V 33/00 | (2006.01) |
| F21W 121/00 | (2006.01) |
| F21Y 115/10 | (2016.01) |
| F21Y 113/13 | (2016.01) |

(52) U.S. Cl.
CPC ........ F21V 23/005 (2013.01); F21V 23/0442 (2013.01); F21V 33/00 (2013.01); G08B 5/36 (2013.01); H05K 5/0213 (2013.01); H05K 7/183 (2013.01); F21W 2121/00 (2013.01); F21Y 2113/13 (2016.08); F21Y 2115/10 (2016.08)

(58) Field of Classification Search
CPC .... F21V 23/005; F21V 33/00; F21V 23/0442; G08B 5/36; H05K 5/0213; H05K 7/183; H05K 7/1488; F21Y 2113/13; F21Y 2115/10; F21W 2121/00
See application file for complete search history.

(56) References Cited

U.S. PATENT DOCUMENTS

| 5,372,262 | A | * | 12/1994 | Benson | A47B 47/02 |
| | | | | | 211/189 |
| 5,574,251 | A | * | 11/1996 | Sevier | H05K 7/183 |
| | | | | | 174/50 |
| 5,975,315 | A | * | 11/1999 | Jordan | H05K 7/183 |
| | | | | | 211/189 |
| 6,006,925 | A | * | 12/1999 | Sevier | H04Q 1/09 |
| | | | | | 211/189 |
| 6,791,027 | B1 | * | 9/2004 | Nicolai | H02B 1/301 |
| | | | | | 174/17 R |

(Continued)

*Primary Examiner* — Dimary S Lopez Cruz
*Assistant Examiner* — Abhishek M Rathod
(74) *Attorney, Agent, or Firm* — Keith L. Jenkins, Registered Patent Attorney, LLC; Keith L. Jenkins (57) ABSTRACT

An electronics rack crown for controlling illumination of an electronics rack responsive to door events, externally visually signaling fault conditions in electronic modules mounted in the rack, providing an interchangeable user brand logo panel with back illumination controllable as to intensity and color, and providing for configuration via DIP switches or by SD card. The electronics rack crown has a front piece and an attached rear piece, with a window in the front piece. In the front piece, a logo plate holder holds a replaceable transparent logo plate aligned to the window in a vertical orientation. An electronics compartment with a transparent top panel is horizontally oriented and aligned to the window. High intensity RGB/W LEDs emit from the top of a circuit board below the transparent top panel and back light the logo plate. The LEDs are controllable based on user configuration, fault detection, and door events.

20 Claims, 9 Drawing Sheets

(56) References Cited

U.S. PATENT DOCUMENTS

| | | | | |
|---|---|---|---|---|
| 7,255,640 B2* | 8/2007 | Aldag | ................ | H05K 7/20572 361/676 |
| 2004/0020873 A1* | 2/2004 | Henderson | ............... | H02B 1/54 211/26 |
| 2008/0276505 A1* | 11/2008 | Hinshaw | ................. | G09F 13/04 40/541 |
| 2012/0026646 A1* | 2/2012 | Thielmann | ........... | H05K 7/1421 361/622 |
| 2015/0002006 A1* | 1/2015 | Segroves | ............. | H05K 7/1491 312/236 |

* cited by examiner

ELECTRONIC RACK CROWN

RELATIONSHIP TO OTHER APPLICATIONS

This application is a continuation in part of U.S. patent application Ser. No. 15/994,721 filed May 31, 2018 to the same inventor, which application is incorporated herein by reference.

FIELD OF ART

The present invention relates to accessories for electronics racks. The present invention more particularly relates to a rack crown providing multiple services to an electronics rack user.

BACKGROUND OF THE INVENTION

Electronics racks are ubiquitous for server farms, telecommunications, and other electronic system supports. Especially in large installations that include many electronics racks, quickly identifying which rack contains a faulty electronics module can be difficult. Another difficulty with conventional electronics racks is that they have poor lighting for illuminating the labels on the fronts of electronic component modules. Another difficulty with conventional electronics racks is that user brand labeling is typically permanent and so creates a market obstacle to reselling or repurposing used electronics racks.

SUMMARY OF THE INVENTION

The present invention provides a fixture for the top of an electronics rack that includes replaceable user brand labeling, fault detection lighting, door event lighting, and lighting for illuminating the fronts of electronics modules that are mounted within the rack. The present invention is described as an adjunct to the DIN rail electronics rack of U.S. patent application Ser. No. 15/994,721 however, the invention is not so limited. An adapter kit may be required to fit on various electronics racks.

An embodiment of the electronics rack crown including: a front piece adapted to be fastened to a top front soffit of an electronics rack structure and a removable logo plate holder supportable in the front piece and alignable to a window opening in the front piece. That electronics rack crown, including either a transparent or a translucent logo plate configured to be supported in the logo plate holder. That electronics rack crown, including an electronics compartment within the front piece, where the electronics compartment includes a transparent top panel. That electronics rack crown, including an electronic circuit board supporting a plurality of high intensity RGB/W LEDs on a top side of the electronic circuit board. That electronics rack crown, including a plurality of rear-facing couplings on a bottom side of the electronic circuit board. That electronics rack crown, where the electronic circuit board includes at least two of: an LED power coupling; an LED controller; an SD card receiver; a fault event input coupling; a door sensor; an array of configuration switches; a reset button; an electronic relay output coupling; and a power input coupling. That electronics rack crown, where: the electronic relay output coupling is operable to be coupled to a white LED light bar, attached to the front soffit, to control the white LED light bar; and the LED controller is operable to control the plurality of high intensity RGB/W LEDs as to intensity and color, responsive to configuration inputs via the configuration switches or said SD card receiver. That electronics rack crown, including a rear piece attached to the front piece and further attached to a top frame of the electronics rack structure. That electronics rack crown, including first and second opposed arms extending rearward along, and attached to, the top frame. That electronics rack crown, where at least one of the first and second opposed arms includes a re-closable compartment. That electronics rack crown, including: a plurality of horizontally directed vents in the front piece; and a plurality of vertically directed vents in the rear piece.

An embodiment of the electronics rack crown including: a front piece adapted to be fastened to a top front soffit of an electronics rack structure; a removable logo plate holder supportable in the front piece and alignable to a window opening in the front piece; and a rear piece attached to the front piece and further attached to a top frame of the electronics rack structure. That electronics rack crown, including either a transparent or a translucent logo plate configured to be supported in the logo plate holder. That electronics rack crown, including: an electronics compartment within the front piece and aligned to the window opening, where the electronics compartment includes a transparent top panel; an electronic circuit board supporting a plurality of high intensity RGB/W LEDs on a top side of the electronic circuit board; and a plurality of rear-facing couplings on a bottom side of the electronic circuit board. That electronics rack crown, where the electronic circuit board includes at least two of: an LED power coupling; an LED controller; an SD card receiver; a fault event input coupling; a door sensor; an array of configuration switches; a reset button; and an electronic relay output coupling. That electronics rack crown, where: the electronic relay output coupling is operable to be coupled to a white LED light bar attached to the front soffit to control the white LED light bar; and the LED controller is operable to control the plurality of high intensity RGB/W LEDs as to intensity and color, responsive to configuration inputs via the configuration switches or the SD receiver. That electronics rack crown, including: a rear piece attached to the front piece and further attached to a top frame of the electronics rack structure; first and second opposed arms extending rearward along, and attached to, the top frame; and where at least one of the first and second opposed arms includes a re-closable compartment. That electronics rack crown, including: a plurality of horizontally directed vents in the front piece; and a plurality of vertically directed vents in the rear piece.

An embodiment of the electronics rack crown including: a front piece adapted to be fastened to a top front soffit of an electronics rack structure; a removable logo plate holder supportable in the front piece and alignable to a window opening in the front piece; a rear piece attached to the front piece and further attached to a top frame of the electronics rack structure; one of a transparent and a translucent logo plate configured to be supported in the logo plate holder; an electronics compartment within the front piece and aligned to the window opening, where the electronics compartment includes a transparent top panel; an electronic circuit board supporting a plurality of high intensity RGB/W LEDs on a top side of the electronic circuit board; and a plurality of rear-facing couplings on a bottom side of the electronic circuit board. where the electronic circuit board includes at least two of: an LED power coupling; an LED controller; an SD card receiver; a fault event input coupling; a door sensor; an array of configuration switches; a reset button; and an electronic relay output coupling; and where: the electronic relay output coupling is operable to be coupled to a white LED light bar attached to the front soffit to control the white LED light bar; and the LED controller is operable to control the plurality of high intensity RGB/W LEDs as to intensity and color, responsive to configuration inputs via the configuration switches or to the SD card receiver. That electronics rack crown, including: a rear piece attached to the front piece and further attached to a top frame of the electronics rack structure; first and second opposed arms extending rearward along, and attached to, the top frame; where at least one of the first and second opposed arms includes a re-closable compartment; a plurality of horizontally directed vents in the front piece; and a plurality of vertically directed vents in the rear piece.

DESCRIPTION OF THE FIGURES OF THE DRAWINGS

The present invention will hereinafter be described in conjunction with the following drawing figures, wherein like numerals denote like elements.

DETAILED DESCRIPTION OF THE INVENTION

As used and defined herein, referential directions such as "right", "left", "upper", "lower", "top", "bottom", "front", "rear", etc., are referenced to a viewer facing the front of the rack crown 102 or the DIN rail electronics rack structure 200 in its operational orientation. As used and defined herein, an "SD card" is a secure digital card, and "LED" is a light-emitting diode, and a "RGB/W" refers to diodes that are red, green, blue, or white, as commanded.

Figure 1:
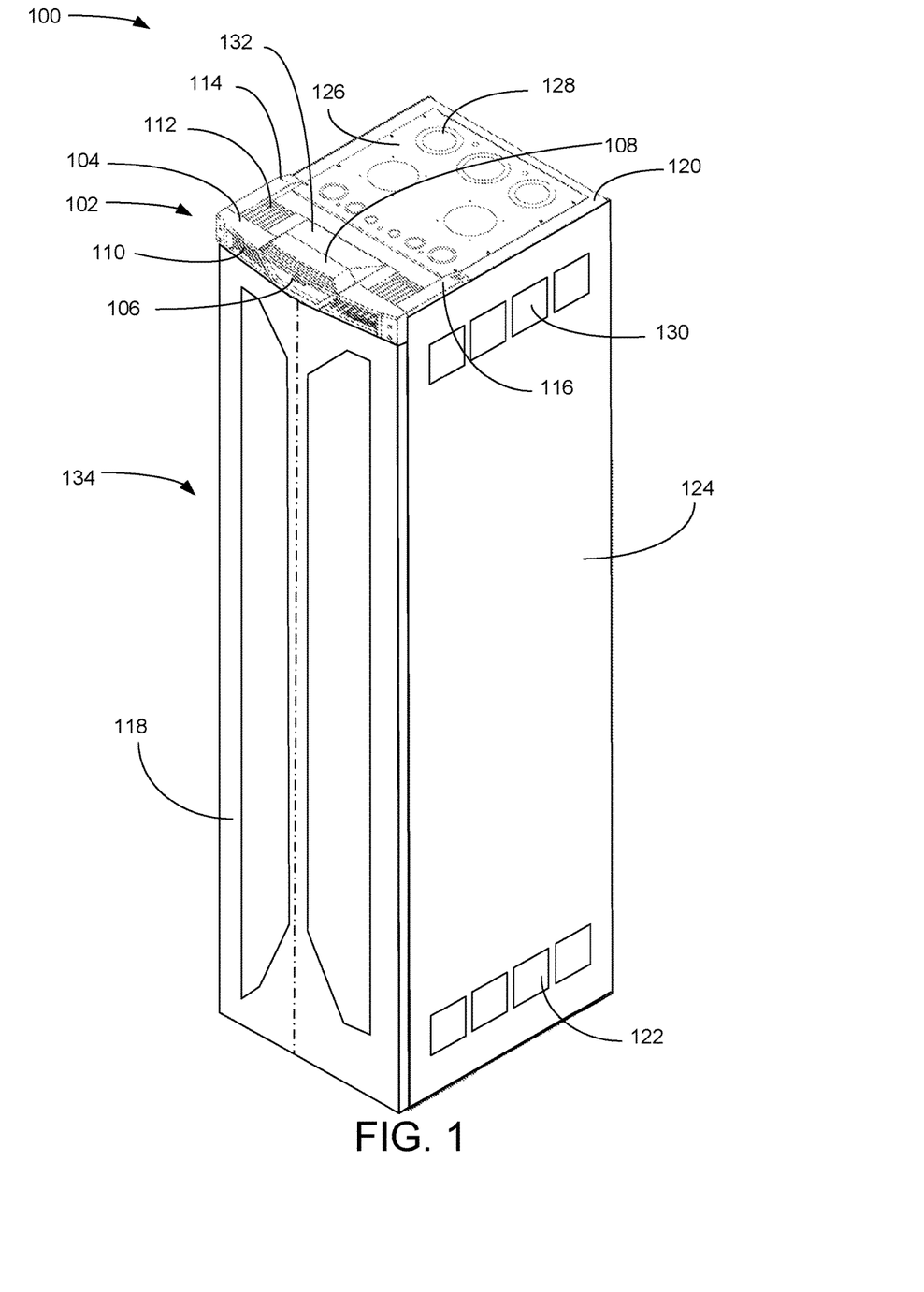
FIG. 1 is a top front perspective view illustrating an exemplary embodiment of an electronics rack crown mounted on an electronic rack cabinet, according to a preferred embodiment of the present invention.

FIG. 1 is a top front perspective view illustrating an exemplary embodiment of an electronics rack crown 102 mounted on an electronic rack cabinet 134, according to a preferred embodiment of the present invention. Electronic rack cabinet 134 includes right side panel 124 with upper right-side vents 130 (one of four labeled), lower right-side vents 122 (one of four labeled), rack top frame 120, top panel 126 with cable knockouts 128 (one of eleven labeled), and front door 118. Electronic rack cabinet 134 also includes a rear door (not shown) and a left side panel 204 (see FIG. 2). Electronic rack cabinet 134 is preferably made of steel.

Rack crown 102 includes front crown piece 104 extending across a front top portion of electronic rack cabinet 134, rear crown piece 132, left extension arm 114, and right extension arm 116, as shown. Front crown piece 104 includes logo plate holder 108, logo plate 106, horizontal vent array 110 (one of two labeled), vertical vent array 112 (one of two labeled), as shown. Rack crown 102 will be described in more detail below. Rack crown 102 is preferably made of plastic.

Figure 2:
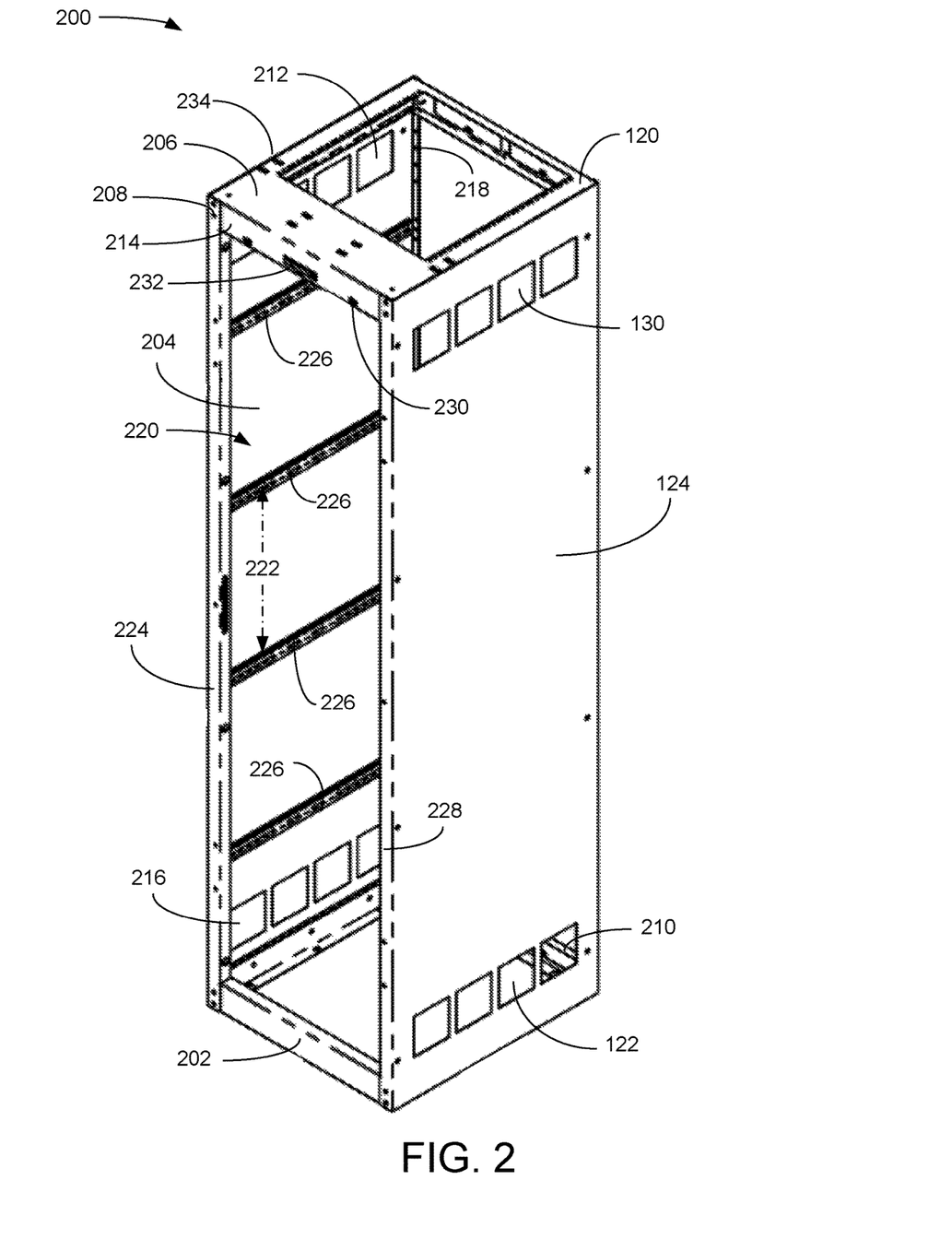
FIG. 2 is a top front perspective view illustrating the exemplary embodiment of a DIN rail electronics rack structure of FIG. 1, according to a preferred embodiment of the present invention.

FIG. 2 is a top front perspective view illustrating the exemplary embodiment of a DIN rail electronics rack structure 200 within the electronic rack cabinet 134 of FIG. 1, according to a preferred embodiment of the present invention. DIN rail electronics rack structure 200 is preferably made of welded steel. Rack top frame 120 connects right and left side panels 124 and 204 and has a crown support panel 206 and extension arm fastener openings 234 (one of four labeled). A soffit 214 extends downward from crown support panel 206 and features soffit electronics access port 232 and snap fit receiver 230 (one of two labeled). Front rack frame left vertical member 224 and front rack frame right vertical member 228 each have two rack crown fastener holes 208 (one of four labeled) near the top of the rack structure 200. Front rack frame left vertical member 224 and front rack frame right vertical member 228 are preferably doubly folded portions of left side panel 204 and right-side panel 124, respectively. DIN rails 226 are mounted on the interior surface 220 of left side panel 204 and are preferably spaced apart with equal spacing 222. Left side panel 204 has upper left side vents 212 (one of four labeled) and lower left side vents 216 (one of four labeled). Right and left side panels 124 and 204 are connected at the bottom by bottom front rack frame member 202 and bottom rear rack frame member 210.

Figure 3:
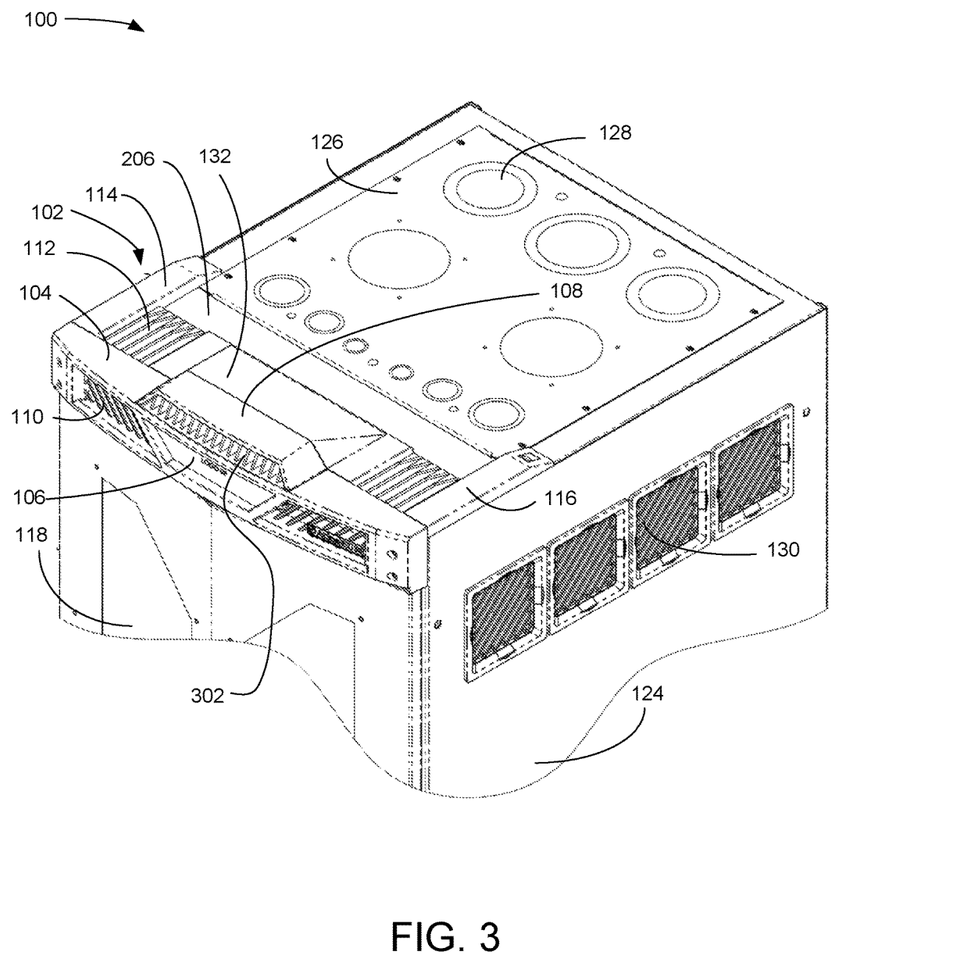
FIG. 3 is a closer top front perspective view illustrating the exemplary embodiment of an electronics rack crown mounted on an electronic rack cabinet of FIG. 1, according to a preferred embodiment of the present invention.

FIG. 3 is a closer top front perspective view illustrating the exemplary embodiment of an electronics rack crown 102 mounted on an electronic rack cabinet 134 of FIG. 1, according to a preferred embodiment of the present invention. Top vents 302 in logo plate holder 108 can be more clearly seen. Upper right-side vents 130, and vents 122, 212, and 216 may include louvers and/or filters.

Figure 4:
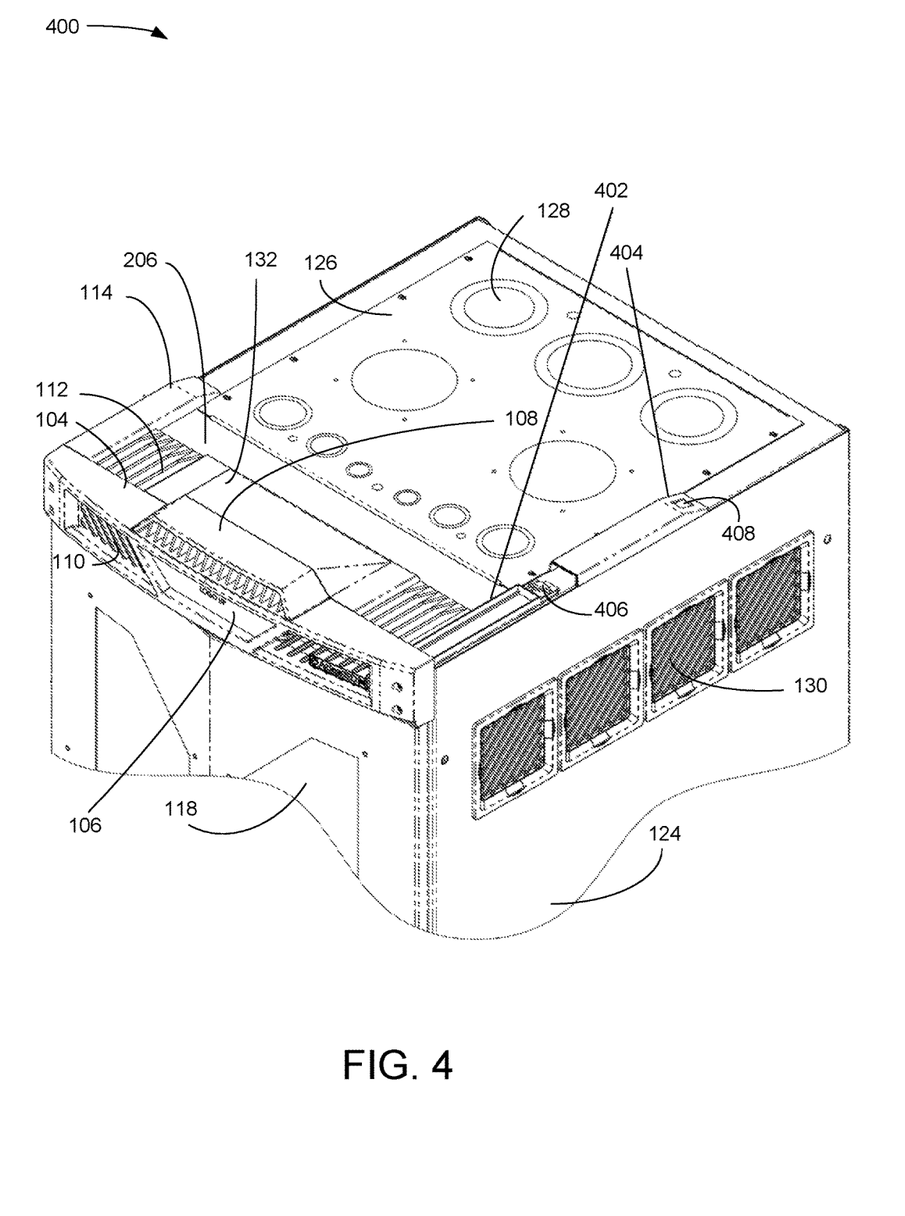
FIG. 4 is a top front perspective view illustrating a second exemplary embodiment of an electronics rack crown mounted on an electronic rack cabinet, according to a preferred embodiment of the present invention.

FIG. 4 is a top front perspective view illustrating a second exemplary embodiment of an electronics rack crown 400 mounted on an electronic rack cabinet 134, according to a preferred embodiment of the present invention. Right extension arm 116 has been replaced with a key compartment 402 for holding cabinet door keys. Key compartment 402 has a sliding key compartment cover 404 with a latch access opening 408. Spring latch 406 is depressed by sliding the compartment cover 404 to a closed position, and then rises into latch access opening 408. By depressing latch 406 via latch access opening 408, the compartment cover 404 can be opened. In a particular embodiment, both right extension arm 116 and left extension arm 114 may comprise key compartments 402.

Figure 5:
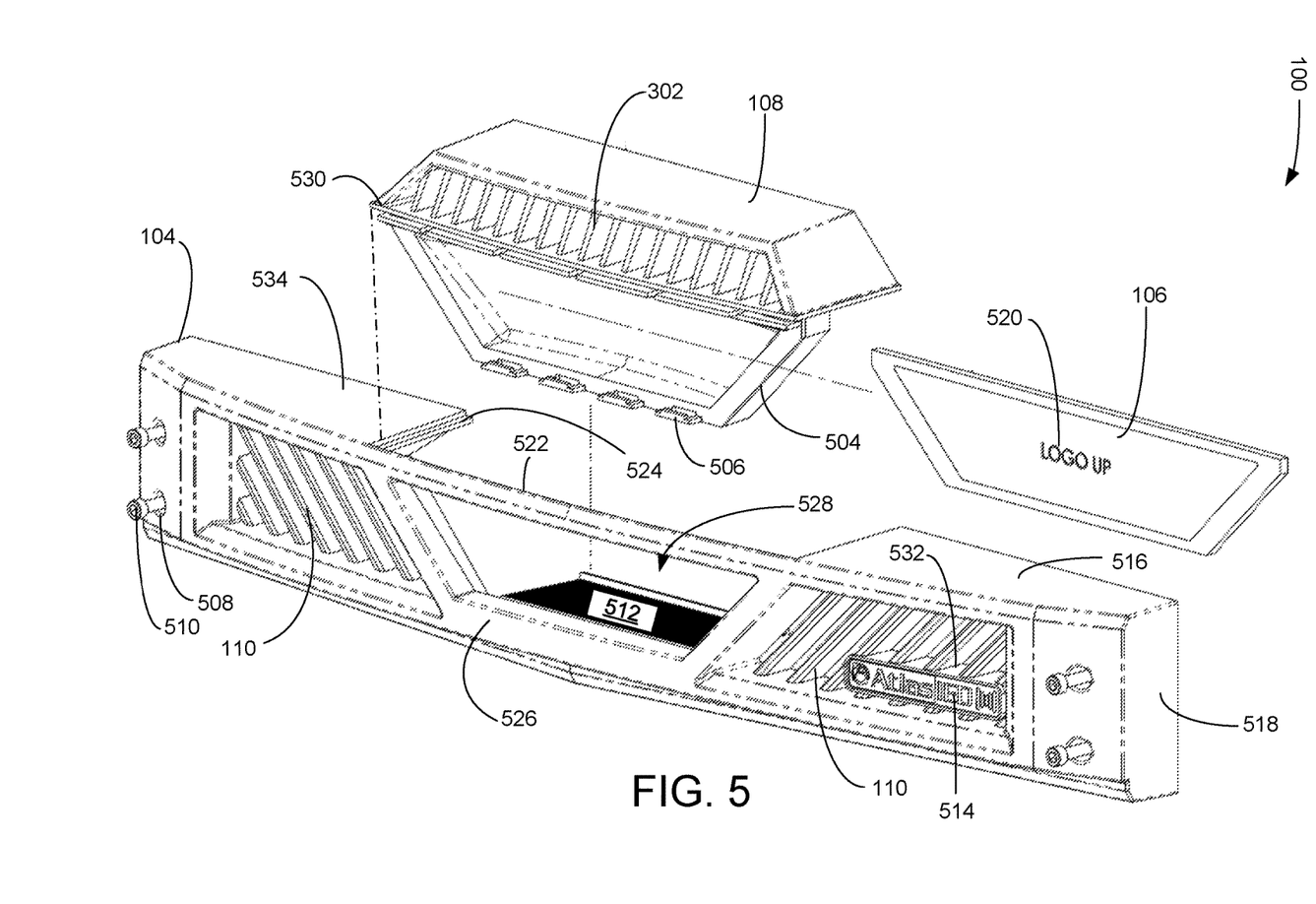
FIG. 5 is an exploded front perspective view illustrating the exemplary embodiment of an electronics rack crown front piece of FIG. 1, according to a preferred embodiment of the present invention.

FIG. 5 is an exploded front perspective view illustrating the exemplary embodiment of an electronics rack crown front piece 104 of FIG. 1, according to a preferred embodiment of the present invention. Electronics rack crown front piece 104 has a chassis 526 that includes a rack crown front piece bottom panel 602 (see FIG. 6), rack crown front piece right side panel 518 (with mirror image on the left end), rack crown front piece top left panel 512, rack crown front piece top right panel 516, horizontal vent arrays 110, and window opening 528, as shown. Window opening 528 is bounded by rack crown front piece top center member 522. Electronics rack crown front piece 104 is fastened to the DIN rail electronics rack structure 200 via fasteners 510 (one of four labeled) inserted into fastener tubes 508 (one of four labeled) and into crown fastener holes 208 (See FIG. 2; one of four labeled). A manufacturer's name plate 514 is attached within name plate socket 532 in right side horizontal vent array 110. Transparent electronics compartment top panel 512 is visible through window opening 528. In a particular embodiment, electronics compartment top panel 512 may be translucent.

Logo plate holder 108 is received between rack crown front piece top left panel 534 and rack crown front piece top right panel 516 which have stepped receiving edges 524 upon which engagement panel 530 of logo plate holder 108 rests. Logo plate holder 108 has an undercarriage 504 for receiving and supporting a logo plate 106 with user's brand logo 520. Undercarriage 504 has a plurality of snap fittings 506 (one of four labeled).

Figure 6:
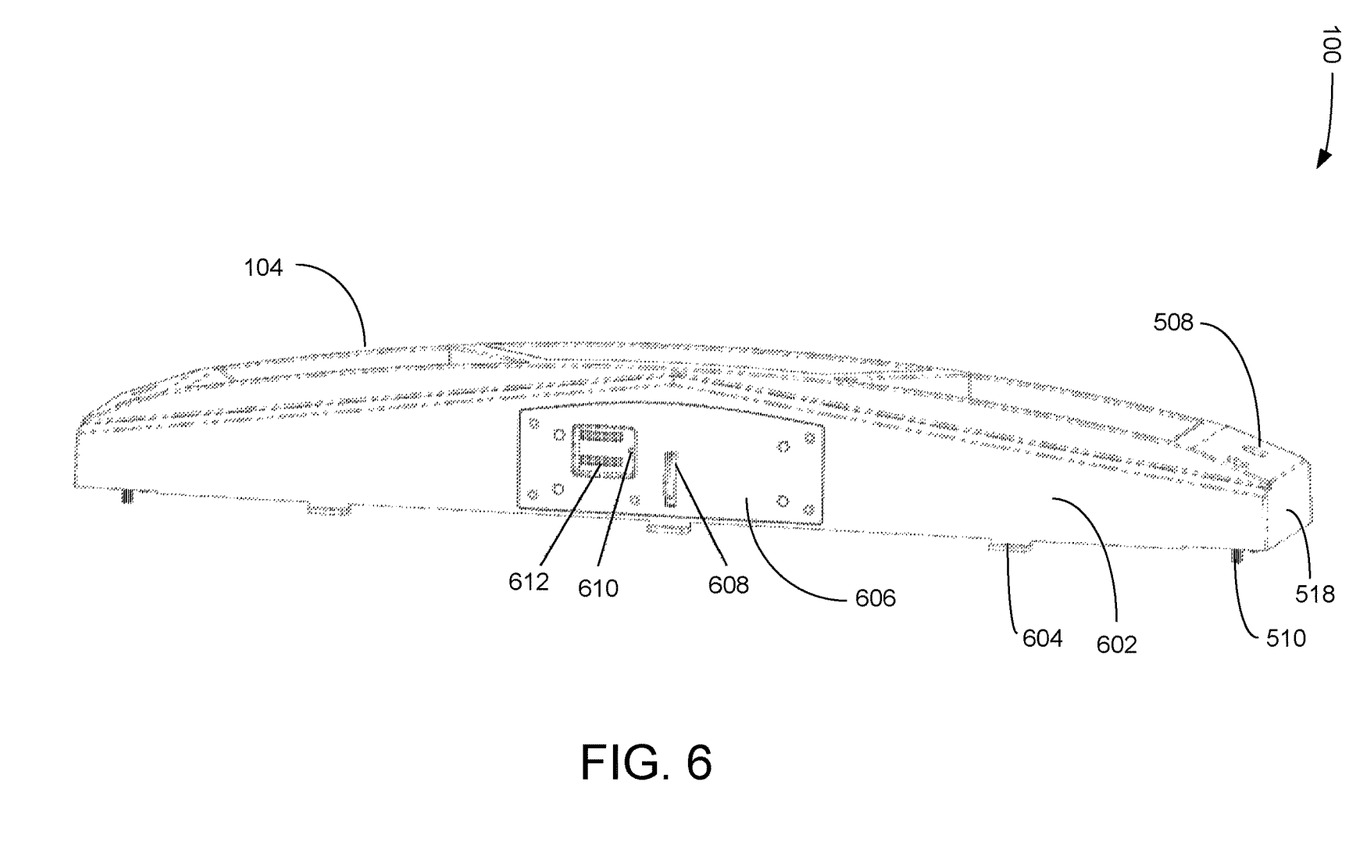
FIG. 6 is a bottom perspective view illustrating the exemplary embodiment of an electronics rack crown front piece of FIG. 1, according to a preferred embodiment of the present invention.

FIG. 6 is a bottom perspective view illustrating the exemplary embodiment of an electronics rack crown front piece 104 of FIG. 1, according to a preferred embodiment of the present invention. Rack crown front piece bottom panel 602 has a plurality of snap fittings 604 (one of three labeled) and a bottom electronics panel 606 of electronics compartment 710 (see FIG. 7). Door sensor 608 extends through bottom electronics panel 606. Reset switch 610 and configuration switches 612 are accessible through bottom electronics panel 606.

Figure 7:
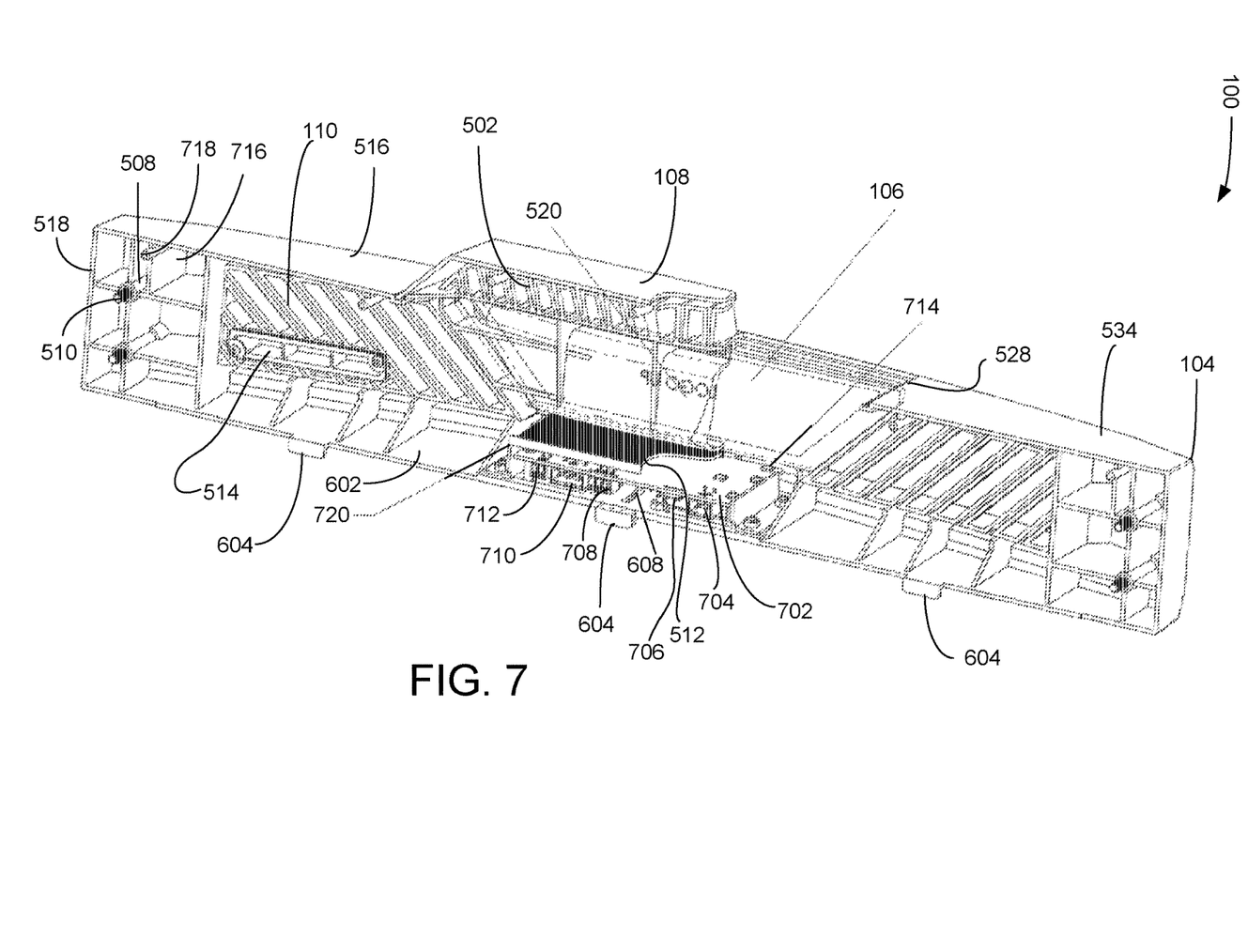
FIG. 7 is a bottom perspective partially cut away view illustrating the exemplary embodiment of an electronics rack crown front piece of FIG. 1, according to a preferred embodiment of the present invention.

FIG. 7 is a bottom perspective partially cut away view illustrating the exemplary embodiment of an electronics rack crown front piece 104 of FIG. 1, according to a preferred embodiment of the present invention. Electronics compartment 720 contains circuit board 702 which, in turn, supports LED power coupling 704, SD card receiver 706, fault event input coupling 708, an electronic relay output 710, and power input coupling 712, all on the underside of the circuit board 702. The top of circuit board 702 supports high intensity RGB/W LEDs 714. LED power coupling 704 accepts LED-compatible power from an appropriate rack-mounted power supply. SD card receiver 706 accepts SD cards with configuration files for changing the electronic configuration of the electronics rack crown front piece 104. Fault event input coupling 708 accepts fault input signals from rack-mounted electronics modules, which signals are used to change the illumination of the logo plate 106 by the RGB/W LEDs 714 to indicate a rack with a faulted module. Electronic relay output 710 is used to trigger custom door-opening and/or door-closing events, such as changing illumination. Power input coupling 712 accepts power input from a rack power supply to supply power to the rack crown electronics.

The electronics rack crown front piece 104 has a number of structural supports 716 (one of many labeled) and two rack crown rear piece couplings 718 (one of two labeled).

Figure 8:
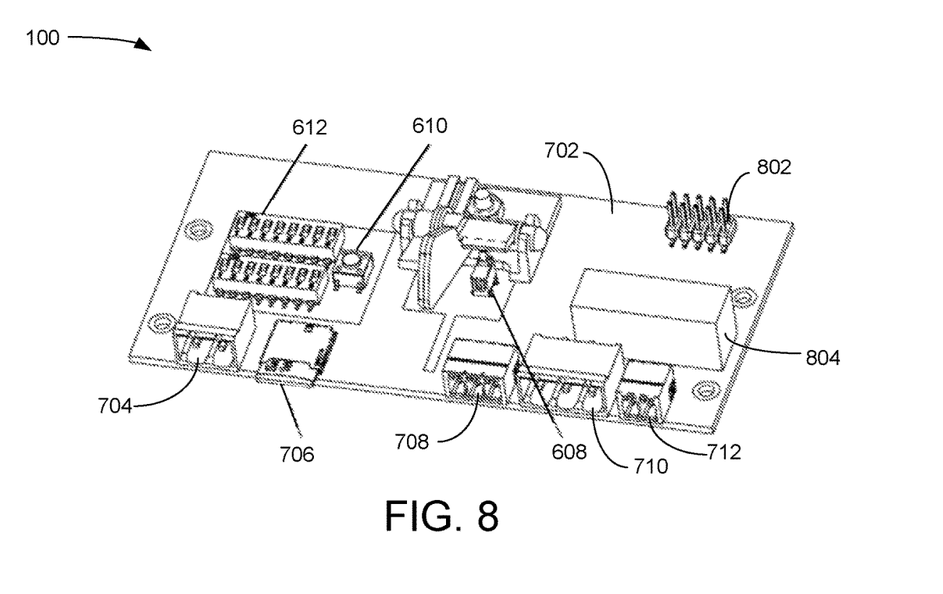
FIG. 8 is a bottom perspective view illustrating the exemplary embodiment of an electronic circuit board of the electronics rack crown of FIG. 1, according to a preferred embodiment of the present invention.

FIG. 8 is a bottom perspective view illustrating the exemplary embodiment of an electronic circuit board 702 of the electronics rack crown 100 of FIG. 1, according to a preferred embodiment of the present invention. In addition to the couplings 704, 706, 708, 710, 712, and door sensor 608, circuit board 702 supports circuit jumpers 802 for manufacturer's configuration settings and LED controller 804 which provides the logic for controlling illumination in the electronics rack crown 100. LED controller 804 is responsive to user inputs via configuration switches 612 and manufacture's inputs via the SD card receiver 706 to control the color and intensity of the high intensity RGB/W LEDs 714.

Figure 9:
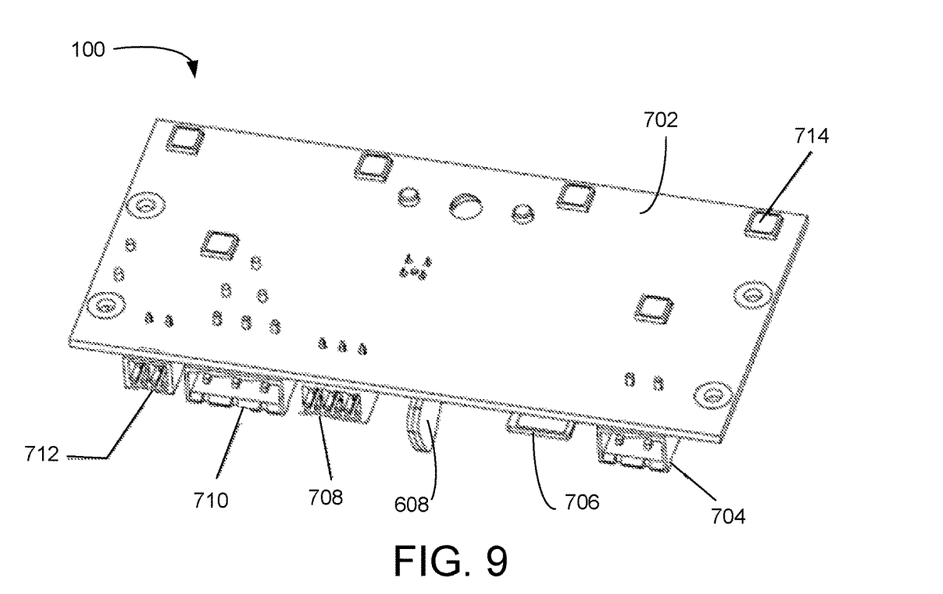
FIG. 9 is a top perspective view illustrating the exemplary embodiment of an electronic circuit board of the electronics rack crown of FIG. 1, according to a preferred embodiment of the present invention.

FIG. 9 is a top perspective view illustrating the exemplary embodiment of an electronic circuit board 702 of the electronics rack crown 100 of FIG. 1, according to a preferred embodiment of the present invention. High intensity RGB/W LEDs 714 (one of six labeled) provide back lighting for the logo plate 106. Color output is controlled to indicate user's preference, manufacturer's configuration, a door event, and/or a fault event. Light intensity, flashing, and/or pulsing may also be controlled responsive to user's preference, manufacturer's configuration, a door event, and/or a fault event.

Figure 10:
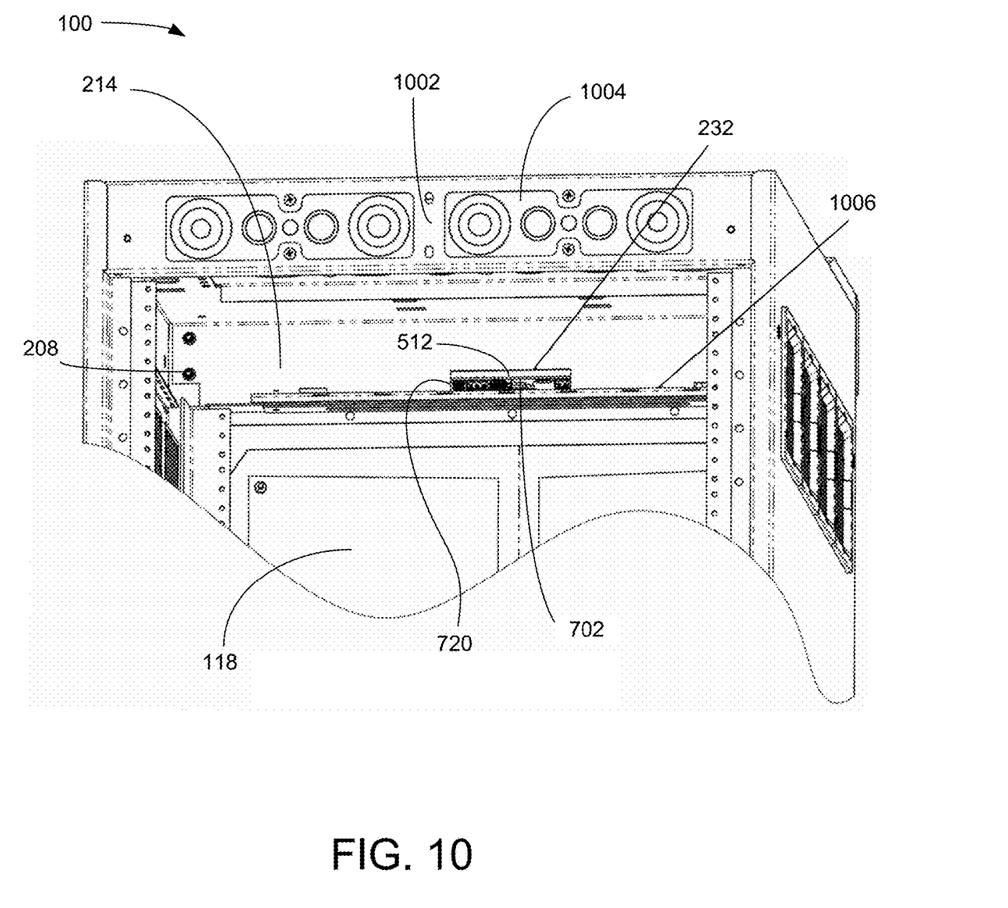
FIG. 10 is a rear perspective view, with the rear door removed, illustrating the exemplary embodiment of an electronics rack crown mounted on an electronic rack cabinet 134 of FIG. 1, according to a preferred embodiment of the present invention.

FIG. 10 is a rear perspective view, with the rear door removed, illustrating the exemplary embodiment of an electronics rack crown 100 mounted on an electronic rack cabinet 134 of FIG. 1, according to a preferred embodiment of the present invention. Rear soffit 1002 supports cable knock out panels 1004 (one of two labeled). Internal rack white LED light bar 1006 is preferably built-in to the rack front soffit 214 to illuminate the fronts of rack-mounted electronics modules, preferably in response to a door event, as enabled via the electronic relay output coupling 710.

While the illustrated embodiments are designed around the electronic rack cabinet 134 of U.S. patent application Ser. No. 15/994,721, the invention is not so limited. An adapter, comprising a front soffit 214 and an equal-height perimeter wall coextensive with a top edge of a generic rack cabinet, and a rack top frame 120 together with fastening adaptations, can be used to adapt the electronics rack crown 100 to a generic rack cabinet.

I claim:

1. An electronics rack crown comprising:
   a. a front piece adapted:
      i. to be fastened to a top front vertical cross panel of an electronics rack structure; and
      ii. to extend above said top front vertical cross panel of said electronics rack structure; and
   b. a removable logo plate holder supportable in said front piece and alignable to a window opening in said front piece.

2. The electronics rack crown of claim 1, comprising one of a transparent and a translucent logo plate configured to be supported in said logo plate holder.

3. The electronics rack crown of claim 1, comprising an electronics compartment within said front piece, wherein said electronics compartment comprises a transparent top panel.

4. The electronics rack crown of claim 3, comprising an electronic circuit board supporting a plurality of high intensity RGB/W LEDs on a top side of said electronic circuit board.

5. The electronics rack crown of claim 4, comprising a plurality of rear-facing couplings on a bottom side of said electronic circuit board.

6. The electronics rack crown of claim 5, wherein said electronic circuit board includes at least two of:
   a. an LED power coupling;
   b. an LED controller;
   c. an SD card receiver;
   d. a fault event input coupling;
   e. a door sensor;
   f. an array of configuration switches;
   g. a reset button;
   h. an electronic relay output coupling; and
   i. a power input coupling.

7. The electronics rack crown of claim 5, comprising:
   a. an electronic relay output coupling mounted on said electronic circuit board, operable to be coupled to a white LED light bar that is attached to said top front vertical cross panel of said electronics rack structure, to control said white LED light bar; and
   b. an LED controller operable to control said plurality of high intensity RGB/W LEDs as to intensity and color, responsive to configuration inputs via an array of configuration switches or an SD card receiver mounted on said electronic circuit board.

8. The electronics rack crown of claim 1, comprising a rear piece having a front portion attached to a rear portion of said front piece and having a bottom portion of said rear piece attached to a top front horizontal cross panel of said electronics rack structure.

9. The electronics rack crown of claim 8, comprising first and second opposed arms extending rearward along, on top of, and attached to, a top frame of said electronics rack structure.

10. The electronics rack crown of claim 9, wherein at least one of said first and second opposed arms comprises a re-closable compartment.

11. The electronics rack crown of claim 8, comprising:
   a. a plurality of horizontally directed vents in said front piece; and
   b. a plurality of vertically directed vents in said rear piece.

12. An electronics rack crown comprising:
   a. a front piece adapted:
      i. to be fastened to a top front vertical cross panel of an electronics rack structure; and
      ii. to extend above said top front vertical panel of said electronics rack structure;
   b. a removable logo plate holder supportable in said front piece and alignable to a window opening in said front piece; and
   c. a rear piece having a front portion attached to a rear portion of said front piece and having a bottom portion of said rear piece attached to a top front horizontal cross panel of said electronics rack structure.

13. The electronics rack crown of claim 12, comprising one of a transparent and a translucent logo plate configured to be supported in said logo plate holder.

14. The electronics rack crown of claim 12, comprising:
   a. an electronics compartment within said front piece and aligned to said window opening, wherein said electronics compartment comprises a transparent top panel;
   b. an electronic circuit board supporting a plurality of high intensity RGB/W LEDs on a top side of said electronic circuit board; and
   c. a plurality of rear-facing couplings on a bottom side of said electronic circuit board.

15. The electronics rack crown of claim 14, wherein said electronic circuit board includes at least two of:
   a. an LED power coupling;
   b. an LED controller;
   c. an SD card receiver;
   d. a fault event input coupling;
   e. a door sensor;
   f. an array of configuration switches;
   g. a reset button; and
   h. an electronic relay output coupling.

16. The electronics rack crown of claim 14, comprising:
   a. an electronic relay output coupling mounted on said electronic circuit board, operable to be coupled to a white LED light bar that is attached to said top front vertical cross panel of said electronics rack structure, to control said white LED light bar; and
   b. an LED controller operable to control said plurality of high intensity RGB/W LEDs as to intensity and color, responsive to configuration inputs via an array of configuration switches or an SD card receiver mounted on said electronic circuit board.

17. The electronics rack crown of claim 12, comprising:
   a. a rear piece attached to said front piece and further attached to a top front horizontal panel of said electronics rack structure;
   b. first and second opposed arms extending rearward along, on top of, and attached to, top frame of said electronics rack structure; and
   c. wherein at least one of said first and second opposed arms comprises a re-closable compartment.

18. The electronics rack crown of claim 12, comprising:
   a. a plurality of horizontally directed vents in said front piece; and
   b. a plurality of vertically directed vents in said rear piece.

19. An electronics rack crown comprising:
   a. a front piece adapted to:
      i. be fastened to a top front vertical cross panel of an electronics rack structure; and
      ii. extend above said top front vertical panel of said electronics rack structure;
   b. a removable logo plate holder supportable in said front piece and alignable to a window opening in said front piece;
   c. a rear piece attached to said front piece and further attached to a top front horizontal panel of said electronics rack structure;
   d. one of a transparent and a translucent logo plate configured to be supported in said logo plate holder;
   e. an electronics compartment within said front piece and aligned to said window opening, wherein said electronics compartment comprises a transparent top panel;
   f. an electronic circuit board supporting a plurality of high intensity RGB/W LEDs on a top side of said electronic circuit board;
   g. a plurality of rear-facing couplings on a bottom side of said electronic circuit board;
   h. wherein said electronic circuit board includes:
      i. an LED power coupling;
      ii. an LED controller;
      iii. an SD card receiver;
      iv. a fault event input coupling;
      v. a door sensor;
      vi. an array of configuration switches;
      vii. a reset button; and
      viii. an electronic relay output coupling; and
   i. wherein:

i. said electronic relay output coupling is operable to be coupled to a white LED light bar attached to said top front vertical cross panel of said electronics rack structure to control said white LED light bar; and ii. said LED controller is operable to control said plurality of high intensity RGB/W LEDs as to intensity and color, responsive to configuration inputs via said configuration switches or to said SD card receiver.

20. The electronics rack crown of claim 19, comprising:
a. first and second opposed arms extending rearward along, on top of, and attached to, a top frame of said electronics rack structure;
b. wherein at least one of said first and second opposed arms comprises a re-closable compartment;
c. a plurality of horizontally directed vents in said front piece; and
d. a plurality of vertically directed vents in said rear piece.

\* \* \* \* \*